Dec. 29, 1959 C. N. FALLIER, JR 2,919,411
AMPLIFIER
Filed Nov. 1, 1957
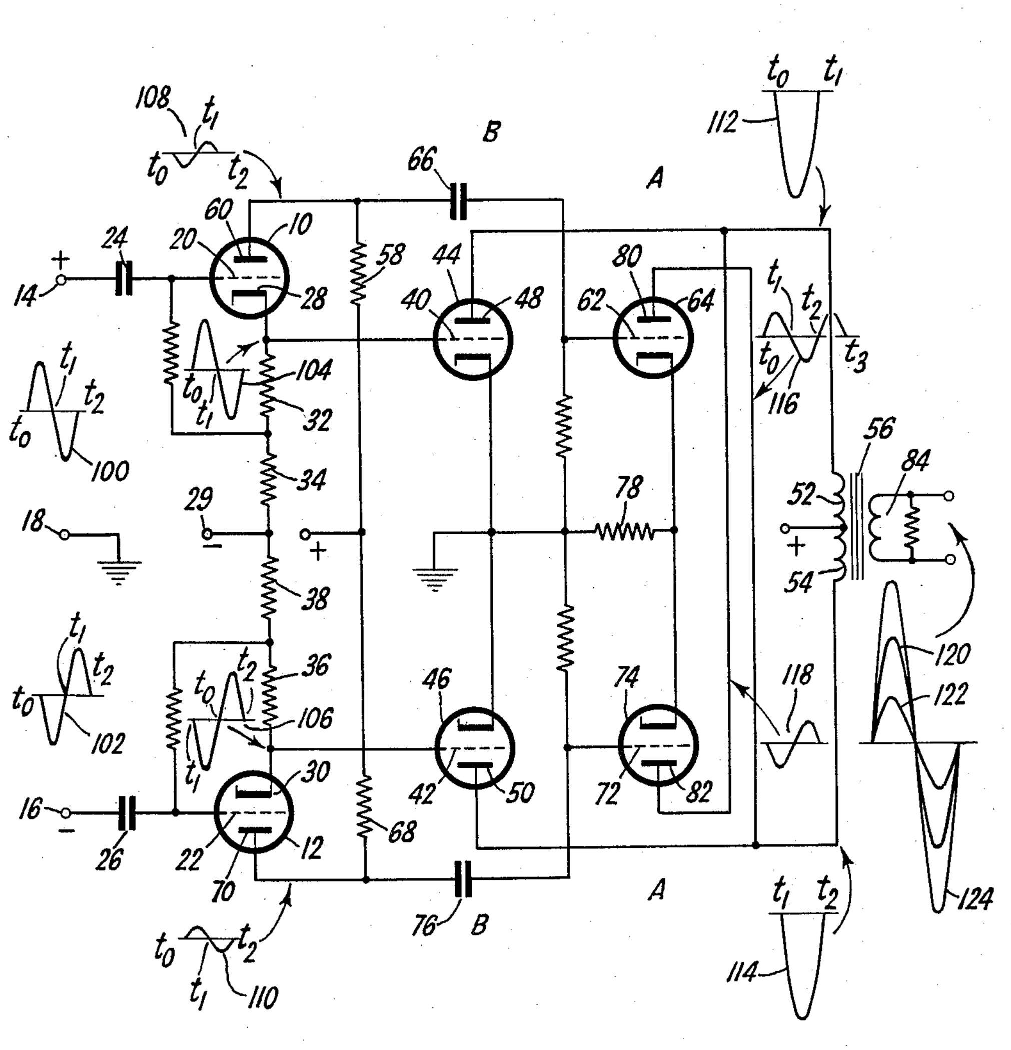
INVENTOR
CHARLES N. FALLIER JR.
BY Theodore Jay Jr.
ATTORNEY 2,919,411
Patented Dec. 29, 1959

2,919,411

AMPLIFIER

Charles N. Fallier, Jr., Hicksville, N.Y., assignor, by mesne assignments, to Sylvania Electric Products Inc., Wilmington, Del., a corporation of Delaware Application November 1, 1957, Serial No. 693,887
1 Claim. (Cl. 330—119)

This invention relates to electronic amplifier circuits.

It is well known to those skilled in the art that the operating efficiency and the distortion present in the output, of an amplifier, vary widely with the type of operation of the amplifier. For example, class A operation, which is the designation for an amplifier which is so biased that plate current flows continuously for the entire electrical cycle, when an alternating signal is applied to the grid, has a low operating efficiency. The distortion level, however, is inherently lower than in other classes of amplifier operation, making it suitable for high quality audio applications.

On the other hand, class B operation, which is the designation for an amplifier which is so biased that plate current flows in pulses lasting approximately half a cycle, when an alternating signal is applied to the grid, has a relatively high operating efficiency. The distortion level, however, is so high that this class of operation cannot be employed in applications where extremely faithful signal reproduction is required, as for example in high quality audio applications.

In particular, the distortion inherent in class B amplification takes the form of a notch or kink in the output signal and is often referred to as a switching transient.

There are two mutually dependent factors which produce the notch; these are the intermittent nature of the current flow in each of the class B tubes, and the leakage reactance between the halves of the primary of the output transformer in the amplifier plate circuit.

The notch is produced during the interval in which the current flow in one tube ceases while the other tube starts to draw current. During this interval, the leakage reactance of the transformer primary acts like an inductance through which the current has suddenly been cut off, thus generating a counter electromotive force which distorts the output wave. The resulting notch amplitude will commonly vary from 2 to 10 percent of the signal amplitude, depending upon the frequency and upon the leakage reactance existing between the two halves of the primary winding. Where the tubes are operated class AB, the distortion percentage will not be as high as for class B, but the effect will persist so long as one of the tubes is rendered non-conductive over a portion of the signal cycle.

Attempts have been made to reduce the leakage reactance and thus reduce the switching transient distortion sufficiently to permit the use of class AB or B amplifiers in high quality audio applications. There are a number of approaches aimed at reducing the leakage reactance, but the penalty in terms of sharply attenuated high frequencies, increased core weight on the order of 10 to 1, or other undesirable alternatives, has been so great that these approaches are entirely unsatisfactory.

Accordingly, it is an object of this invention to reduce the distortion level of class B and class AB amplifiers to such a value as to permit their use in applications where a signal of very high fidelity is required.

Another object of this invention is to reduce the distortion level of class AB and class B amplifiers without the use of high cost output or bulky output transformers or complicated circuitry.

Still another object is to eliminate the switching transient in a class AB and class B amplifier.

These and other objects of my invention will either be explained or will become apparent hereinafter.

In accordance with the principles of my invention, the switching transient or notch appearing in the output circuit of an inductance loaded amplifier can be substantially eliminated by providing means associated with the inductance to prevent the generation of the counter electromotive force in the inductance which introduces distortion in the amplifier output.

More particularly, I provide in combination with an amplifier, a load inductance, first, second, third and fourth amplifiers, the outputs of the second and third amplifiers being coupled to one end of the load and the outputs of the first and fourth amplifiers being coupled to the other end of the load. The inputs of the first and fourth amplifiers are responsive to a first set of signals in phase with each other, and the inputs of the second and third amplifiers are responsive to a second set of signals which are in phase with each other, corresponding signals in the first set being opposed in phase to corresponding signals in the second set. In this arrangement, the first and second amplifiers can be conductive for at least half of the electrical cycle, for example, class B. The third and fourth amplifiers, however, conduct for the full electrical cycle, i.e., class A. This prevents any period of complete cessation of current through a portion of the load. Since, therefore, no counter electromotive force is induced in the load, the transient distortion is practically eliminated.

An illustrative embodiment of my invention will now be described in detail.

Referring to the accompanying drawing, an input circuit is shown comprising two split load phase inverters 10 and 12, each of which acts as a signal source, supplying signals to amplifier tubes in the circuit. Signals applied between the input terminals 14 and 18 and 16 and 18 are fed to the grids 20 and 22 of tubes 10 and 12, respectively, through coupling capacitors 24 and 26.

The cathodes 28 and 30 of the phase inverters 10 and 12 respectively, are connected to a source 29 of negative potential through resistors 32, 34 and 36, 38 respectively. The tubes 10 and 12 are operated class A, the proper bias being determined by the resistors 32 and 36, which for example are equal in value.

The cathodes 28 and 30 are also connected, respectively, to the grids 40 and 42 of a first amplifier 44 and a second amplifier 46. The plates 48 and 50 of the amplifiers 44 and 46 respectively, are connected to opposite halves 52 and 54 of the primary of an output transformer 56. These two amplifiers are connected in push-pull relationship and are operated class B. Class AB may also be employed but class B is preferred for its superior operating efficiency.

In order to operate amplifier 44 class B, the resistor 34 must be chosen so that its value plus the value of resistor 32 (which has previously been selected for proper operation of tube 10) will bias the amplifier at cut-off when no signal is applied to the grid 40. A like consideration applies to the selection of resistor 38 with regard to the class B amplifier 46.

The signal at the plate 60 of the inverter tube 10 is developed across the plate load resistor 58 and applied to the grid 62 of a third amplifier 64 through the coupling capacitor 66; likewise, the signal at the plate 70 of the inverter tube 12 is developed across the plate load resistor 68, and applied to the grid 72 of a fourth amplifier 74 through the coupling capacitor 76. The third and fourth amplifiers are also connected in push-pull relationship, as are the first and second amplifiers, but are biased to operate class A by a proper choice of the value of the common cathode resistor 78.

The plates 80 and 82 of the class A amplifiers 64 and 74 respectively, are connected to opposite halves of the primary of the output transformer 56, as also are the plates of the class B amplifiers. It will be noted, however, that while the plate 48 of the first amplifier 44 is connected to the top winding 52 of the primary of transformer 56, the plate 80 of the third amplifier 64 is connected to the opposite winding 54; likewise, the plate 50 of the second amplifier 46 is connected to the bottom winding 54, and the plate 82 of the fourth amplifier 74 is connected to the top winding 52.

Thus connected, it will be seen that the signal developed in the secondary 84 of the output transformer 56 is the sum of the output signals of the class A amplifiers 64 and 74, and the class B amplifiers 44 and 46. The greater portion of this signal, i.e. preferably from about 70% to 80%, is output from the class B amplifiers, the remaining 20% to 30% being derived from the class A amplifiers. Since the greater portion is supplied by the class B amplifiers, the superior efficiency of this class of operation is realized.

In order that at least 70% of the output be supplied from the class B amplifiers, the value of the plate load resistors 58 and 68 must be chosen with respect to the sum of the cathode resistors 32, 34 and 36, 38, respectively, so that the amplitude of the signals developed across the plate load resistors limits the class A amplifier output to 30% or less of the combined class A—class B output.

The operation of the circuit is as follows:

Push-pull signals, having the shape of a sine wave, for example, are applied to the input terminals 14—18 and 16—18. Such signals are represented by the waveforms 100 and 102 at the terminals 14—18 and 16—18 respectively. It will be observed that the signals are identical in amplitude waveform and frequency, but are opposed in phase.

These signals are fed to the grids 20 and 22 of the tubes 10 and 12, respectively. Signals 104 and 106, in phase with signals 100 and 102, respectively, will then appear on the cathodes 28 and 30 of tubes 10 and 12. At the plates 60 and 70 of tubes 10 and 12, the signals 108 and 110 are of course opposed in phase with the input signals, and are reduced in amplitude, rather than increased since the plate load resistance values 58 and 68 have been chosen to limit the class A output to 30% of the total.

It will be seen that each of the tubes 10 and 12 provides two signals, one at the cathode and the other at the plate, which are opposed in phase and differing in amplitude. In the case of tube 10, the cathode signal 104 is opposed in phase with and has a larger amplitude than the plate signal 108; the same condition is true for the tube 12 and its associated cathode and plate signals 106 and 110.

The cathode signals 104 and 106 are applied to the grids of the amplifiers 44 and 46, but since these are class B amplifiers, only the positive halves of the signals 104 and 106 are amplified. These amplified signals appear with the phase relationship shown by waveforms 112 and 114 in the output circuits. In the output transformer primary there will be a phase reversal of signal 112 with respect to signal 114 so that the signal induced in the transformer secondary 84 will again be a continuous sine wave having a shape and phase relationship shown by the waveform 120. This signal has the same waveform as the input signal at terminals 14, 16, 18, but has a much larger amplitude.

The plate signals 108 and 110 of the tubes 10 and 12 are coupled to the grids of the class A amplifiers 64 and 74, respectively, where they are amplified to produce the waveforms 116 and 118. These signals are fed, as are the output signals from the class B amplifiers, into the primary of the output transformer 56. Here a phase reversal occurs and a signal is induced in the secondary having a shape and phase relationship shown by waveform 122. This signal is the sum of the signals 116 and 118 which, due to their phase relationship with each other, are additive. The waveforms 120 and 122 are in phase with each other and combine to produce the output signal 124 at the output terminals of the secondary 84.

From the following detailed analysis it will be clear why the invention greatly reduces the transient distortion present in the output of a class B amplifier. In this regard it should be remembered that the switching transient distortion results because the cessation of conduction by each class B amplifier, 44 and 46, cuts off the current flow through each half of the transformer 52—54 every half cycle.

For example, with reference to the class B amplifier 44, it is clear that the output signal 112 flows in the top half of the primary 52 for the period $t_0$ to $t_1$ but not from the period $t_1$ to $t_2$. During the time $t_0$ to $t_1$, the output signal 118 from the class A amplifier which is in phase with the output signal 112, also flows in the primary section 52. However, at time $t_1$, although the class B signal 112 ceases to flow, the continuation of the class A signal 118 continues to flow in the winding 52 for the half cycle period $t_1$ to $t_2$. The continuous flow of current thus produced prevents the development of a counter electromotive force in the winding 52 and hence greatly reduces the transient distortion.

Although the operation in the foregoing paragraph has been described with reference to the class B amplifier 44 and the class A amplifier 74, it is clear that on the following half cycle, the same operation will be repeated by the class B amplifier 46 and the class A amplifier 64 with regard to the other half 54 of the transformer primary. Thus, from the period $t_1$ to $t_2$, the signal 114 will flow in the winding 54, along with the signal 116 which is in phase therewith. From the period $t_2$ to $t_3$, however, when the signal 114 is zero, the signal 116 will still flow in the winding 54, thus preventing the development of a counter electromotive force in the winding 54.

In order that the class A signal flow in the primary 52—54 be effective in reducing the transient distortion, it must comprise a significant percentage of the total signal flowing therein. I have found that a class A signal comprising about 20% to 30% of the total output available at the transformer secondary 84 so reduces the transient distortion of the circuit output as to permit its use for high quality audio applications.

While I have shown and pointed out my invention as applied above, it will be apparent to those skilled in the art that many modifications can be made within the scope and sphere of my invention as defined in the claim which follows:

What is claimed is:

An amplifier responsive to first and second incoming push-pull signals and comprising first and second paraphase amplifier stages respectively responsive to said first and second signals, said first stage producing third and fourth push-pull signals respectively proportional to said first signal, said second stage producing fifth and sixth push-pull signals respectively proportional to said second signal; a third class A push-pull amplifier stage having first and second electron tubes respectively coupled to first and second opposite ends of a center tapped inductive load, said first and second tubes being respectively responsive to said fourth and sixth signals; and a fourth class B push-pull amplifier stage having third and fourth electron tubes respectively coupled to said second and first ends of said load, said third and fourth tubes being respectively responsive to said third and fifth signals.

References Cited in the file of this patent

UNITED STATES PATENTS

| | | |
|---|---|---|
| 2,074,047 | Dechant | Mar. 16, 1937 |
| 2,646,469 | Long | July 21, 1953 |

OTHER REFERENCES

Publication: Audio-High Fidelity, June 1957, pages 31–34, "Multichannel Amplification," by Scott.